United States Patent [19]
Watabe et al.

[11] Patent Number: 5,559,348
[45] Date of Patent: Sep. 24, 1996

[54] SEMICONDUCTOR DEVICE HAVING INSULATED GATE BIPOLAR TRANSISTOR

[75] Inventors: Kiyoto Watabe; Ikunori Takata; Masana Harada, all of Hyogo, Japan

[73] Assignee: Mitsubishi Denki Kabushiki Kaisha, Tokyo, Japan

[21] Appl. No.: 460,942

[22] Filed: Jun. 5, 1995

[30] Foreign Application Priority Data

Nov. 11, 1994 [JP] Japan .................................. 6-277429

[51] Int. Cl.⁶ .......................... H01L 29/74; H01L 27/01; H01L 23/58
[52] U.S. Cl. ..................... 257/141; 257/347; 257/491
[58] Field of Search .................................. 257/139, 141, 257/341, 343, 487, 488, 490

[56] References Cited

U.S. PATENT DOCUMENTS 4,963,951  10/1990  Adler et al. ............................. 257/141
5,430,316  7/1995  Contiero et al. ........................ 257/341

FOREIGN PATENT DOCUMENTS 59-132667  7/1984  Japan .
3-105980  5/1991  Japan .
4-133355  5/1992  Japan .
4-274368  9/1992  Japan .
5-109774  4/1993  Japan .
5-235332  9/1993  Japan .

OTHER PUBLICATIONS

"A Novel Heavily Doped Drift—Auxiliary Cathode Lateral Insulated Gate Transistor Structure", Haung et al., Proceedings of 1990 International Symposium, pp. 102–107.

"200° C. High-Temperature and High-Speed Operation of 440V Lateral IGBTs on 1.5 μmthick SOI", Nakagawa et al., 1993 IEEE, pp. 687–690.

*Primary Examiner*—Wael M. Fahmy
*Attorney, Agent, or Firm*—Lowe, Price, LeBlanc & Becker

[57] ABSTRACT

A semiconductor device which allows an ON-state voltage to be lower than that of a conventional device and a method of manufacturing such a device. In this semiconductor device, a gate electrode is formed to have a planar area of its region covering a first base layer larger than that of its region covering a second base layer, thereby increasing a cathode short-circuit ratio of a cathode-shorted diode equivalent to this semiconductor device. As a result, a lower voltage than conventional ON-state can be obtained.

13 Claims, 10 Drawing Sheets

SEMICONDUCTOR DEVICE HAVING INSULATED GATE BIPOLAR TRANSISTOR

BACKGROUND OF THE INVENTION

1. Field of the Invention

The present invention relates to semiconductor devices and, more particularly, insulated gate bipolar transistors (IGBT: Insulated Gate Bipolar Transistor).

2. Description of the Background Art

Power ICs formed by integrating power elements having high breakdown voltage and large current characteristics together with a drive circuit and a protection circuit thereof are expected to be the mainstream of future power elements. A preferable gate driving method for such a power element is a voltage-controlled type using an insulated gate electrode (MOS gate) because the voltage-controlled type enables gate drive with less current than that required for a current-driven type.

Among integrated circuits (IC) manufactured by integrating a plurality of semiconductor devices on a single semiconductor substrate, an IC containing a high breakdown voltage element is called a power IC. A transistor including a MOS gate which is commonly used as such a high breakdown voltage element (power MOSFET, IGBT, etc.) has its channel portion ordinarily formed by the DSA (Diffusion Self Alignment) method. In the DSA method, a source diffusion layer and a channel diffusion layer having the opposite polarity to that of the source diffusion layer are formed by using one end surface of the same polysilicon gate electrode as a diffusion window.

Figure 19:
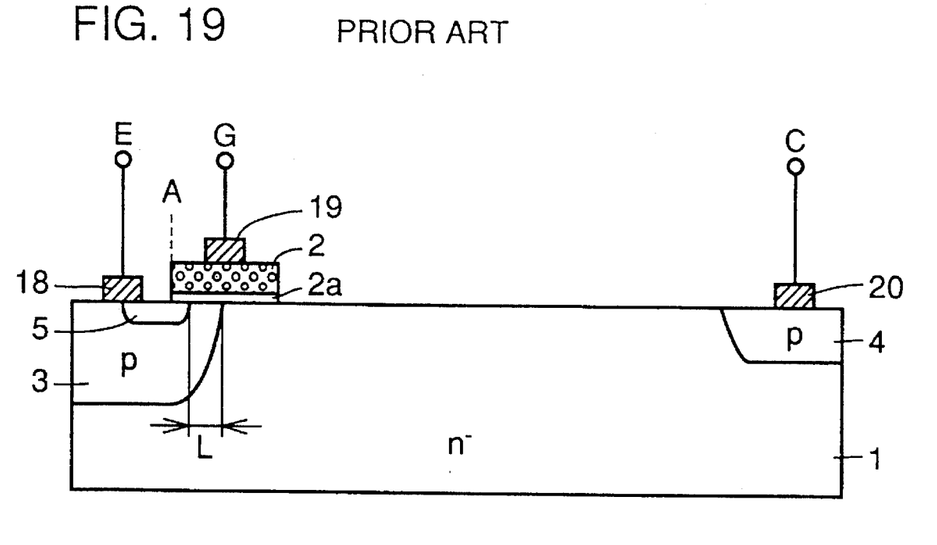
FIG. 19 is a sectional view showing a conventional horizontal IGBT.

FIG. 19 is a sectional view showing a horizontal IGBT manufactured by the conventional DSA method. With reference to FIG. 19, in the conventional IGBT, a p-type base layer 3 is formed in a predetermined region of the main surface of a high-resistance n-type substrate 1 constituting an n-type base layer. An n-type emitter layer 5 is formed in a predetermined region of the main surface of p-type base layer 3. A gate electrode 2 is formed on a region between n-type emitter layer 5 and n-type base layer 1 and on a predetermined region of the main surface of n-type base layer 1, with a gate insulating film 2a interposed therebetween. A p-type collector layer 4 is formed in a region of the main surface of n-type base layer 1 located at a predetermined interval from the above n-type base layer 3. An emitter electrode 18, a gate contact electrode 19 and a collector electrode 20 are respectively formed on n-type emitter layer 5, gate electrode 2 and p-type collector layer 4 to be in contact therewith.

In the process for manufacturing p-type base layer 3, n-type emitter layer 5 and p-type collector layer 4 of the horizontal IGBT shown in FIG. 19, an impurity is first diffused into n-type base layer 1 from the left of the position A in the figure by using gate electrode 2 as a mask to form p-type base layer 3. Then, p-type collector layer 4 is formed by diffusing an impurity into a region of the main surface of n-type base layer 1 located at a predetermined distance from p-type base layer 3. In the same manner as in the formation of p-type diffusion layer 3, an n-type impurity is diffused from the left of the position A by using gate electrode 2 as a mask to form n-type emitter layer 5.

In the conventional horizontal IGBT shown in FIG. 19, application of a positive voltage with respect to a potential of n-type emitter layer 5 to gate electrode 2 results in formation of an n-type channel in the main surface of p-type base layer 3 located under gate electrode 2. As a result, electrons flow into p-type collector layer 4 through n-type base layer 1. At this time, holes are introduced into n-type base layer 1 from p-type collector layer 4 so as to satisfy charge neutrality conditions. Conductivity modulation then occurs to result in a lower ON-state voltage than that of a power MOSFET. Since a switching loss is a product of an ON-state voltage and a turn-off time, the ON-state voltage should be low and the turn-off time should be short in order to reduce power consumption. While the conventional IGBT allows its ON-state voltage to be lower than that of a power MOSFET, it does not allow further reduction of its ON-state voltage with ease.

Figure 20:
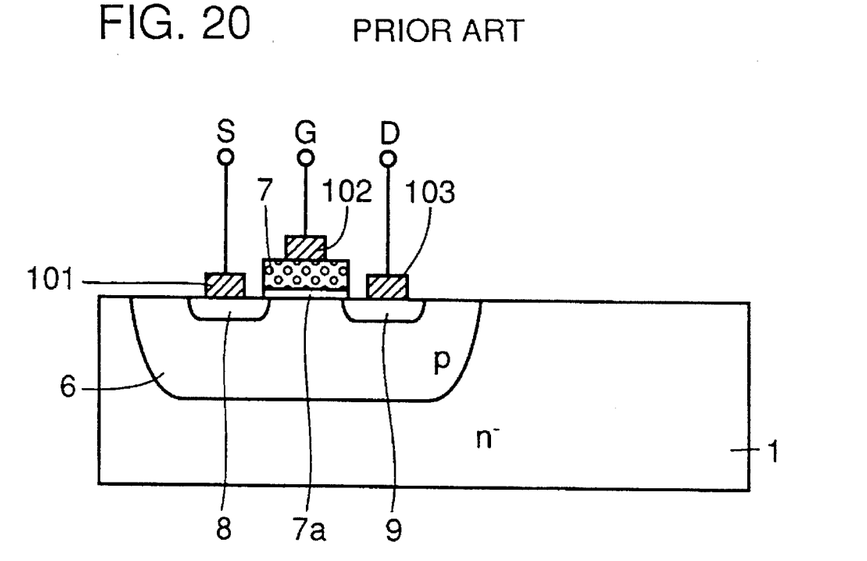
FIG. 20 is a sectional view showing a conventional low-resistance MOSFET.

In addition, a conventional power IC requires an IGBT, a high breakdown voltage element, and a low breakdown voltage element for constituting a logic circuit such as a CMOS to be formed on the same semiconductor substrate. FIG. 20 is a sectional view of a conventional n-channel MOSFET. With reference to FIG. 20, in the MOSFET, a p-type well diffusion layer 6 is formed in a predetermined region of the main surface of an n-type semiconductor substrate 1. N-type diffusion layers 8 and 9 constituting source/drain regions are formed at a predetermined interval from each other in predetermined regions of the main surface of p-type well diffusion layer 6 so as to sandwich a channel region. A gate electrode 7 is formed on the channel region with a gate insulating film 7a interposed therebetween. A source electrode 101, a gate contact electrode 102 and a drain electrode 103 are formed on n-type diffusion layer 8, gate electrode 7 and n-type diffusion layer 9, respectively.

Description will be given of a conventional process of manufacturing an n-channel MOSFET in a case where the n-channel MOSFET, a low breakdown voltage element shown in FIG. 20, and the IGBT, a high breakdown voltage element shown in FIG. 19, are formed on the same substrate. First, a p-type well diffusion layer 6 is formed in a predetermined region of the main surface of n-type semiconductor substrate 1 having the same resistance as that of a high breakdown voltage element. Then, gate electrode 7 is formed on a predetermined region of the main surface of p-type well diffusion layer 6 with gate insulating film 7a interposed therebetween. Thereafter, n-type diffusion layers 8 and 9 constituting source/drain regions are formed by implanting ions of an n-type impurity into p-type well diffusion layer 6 using gate electrode 7 as a mask. Then, source electrode 101, gate contact electrode 102 and drain electrode 103 are formed on n-type diffusion layer 8, gate electrode 7 and n-type diffusion layer 9, respectively. Thus, such a low breakdown voltage n-channel MOSFET as shown in FIG. 20 is obtained.

When in forming the structures shown in FIGS. 19 and 20 on the same substrate, both of p-type base layer 3 of the high breakdown voltage element (IGBT) shown in FIG. 19 and p-type well diffusion layer 6 of the low breakdown voltage element (MOSFET) shown in FIG. 20 are diffusion layers for forming channel portions. However, while the p-type channel portion of the high breakdown voltage element uses a horizontal diffusion region of p-type base layer 3, the p-type channel portion of the low breakdown voltage element uses a longitudinal diffusion region of p-type well diffusion layer 6. For forming the channel regions of the low breakdown voltage element and the high breakdown voltage element to have the same impurity concentration, it is therefore necessary to make the amount of impurity diffusion at the time of forming p-type base layer 3 different from that at the time of forming p-type well diffusion layer 6. This conventionally makes it difficult to form p-type base layer 3 and p-type well diffusion layer 6 by the same process.

SUMMARY OF THE INVENTION

One object of the present invention is to provide a semiconductor device which allows an ON-state voltage to be lower than that of a conventional device.

Another object of the present invention is to readily manufacture a semiconductor device, in which a low breakdown voltage element and a high breakdown voltage element are formed on the same substrate, to have an ON-state voltage of the high breakdown voltage element lower than a conventional ON-stage voltage without causing complication of a manufacturing process.

A semiconductor device according to one aspect of the present invention includes a first base layer of a first conductivity type, a second base layer of a second conductivity type, an emitter layer of the first conductivity type, a collector layer of the second conductivity type, an insulating film and a gate electrode. The second base layer is formed in a predetermined region of the main surface of the first base layer. The emitter layer is formed in a predetermined region of the main surface of the second base layer. The collector layer is formed in a region of the main surface of the first base layer at a predetermined distance from the second base layer. The insulating film is formed in a region on the main surface of the first base layer between the second base layer and the collector layer. The gate electrode is formed on a region of the second base layer located between the emitter layer and the first base layer and in a predetermined part on a region of the first base layer located between the second base layer and the collector layer. The gate electrode is formed to have a planar area of its region covering the first base layer larger than that of its region covering the second base layer as well as extending over the upper surface of the insulating film. Preferably, a shield layer of the second conductivity type may be formed in a region of the first base layer in the vicinity of the insulating film and located between the second base layer and the insulating film in order to prevent application of high electric fields to the gate insulating film.

Being manufactured to have a planar area of the gate electrode region covering the first base layer larger than that of the gate electrode region covering the second base layer, this semiconductor device has a lower ON-state voltage than the conventional one. In addition, forming the above-described shield layer in a region in the vicinity of the insulating film between the second base layer and the insulating film, application of high electric fields to the gate insulating film can be prevented.

A semiconductor device according to another aspect of the present invention includes a first base layer of a first conductivity type, a second base layer of a second conductivity type, an emitter layer of the first conductivity type, a collector layer of the second conductivity type, an insulating film, a shield layer of the second conductivity type and a gate electrode. The shield layer is formed in a region of the first base layer in the vicinity of the insulating film between the second base layer and the insulating film. The gate electrode is formed on a region located between the emitter layer of the second base layer and the first base layer and on a region located between the second base layer and the shield layer in the first base layer, with a gate insulating film interposed therebetween. The gate electrode is formed to have a planar area of its region covering the first base layer larger than that of its region covering the second base layer. Preferably, a shield electrode and an emitter electrode may be respectively formed on the above-described shield layer and the emitter layer to be short-circuited with each other by an interconnection layer.

Being manufactured to have a planar area of a gate electrode region covering the first base layer larger than that of a gate electrode region covering the second base layer, this semiconductor device has an ON-state voltage lower than a conventional one. In addition, since the shield layer is formed in a region of the first base layer in the vicinity of the insulating film between the second base layer and the insulating film, application of high electric fields to the gate insulating film can be prevented. Forming the shield electrode on the shield layer and the emitter electrode on the emitter layer and short-circuiting the two electrodes through the interconnection layer results in the shield layer protecting the gate insulating film while serving as an outlet for hole current in the off state. As a result, part of the hole current flows directly to the emitter electrode through the shield layer to reduce latch-up effects.

A semiconductor device according to a further aspect of the present invention includes a first base layer of a first conductivity type, a second base layer of a second conductivity type, a first emitter layer of the first conductivity type, a collector layer of the second conductivity type, a shield layer of the second conductivity type, a second emitter layer of the first conductivity type and a gate electrode. The first emitter layer is formed in a predetermined region of the main surface of the second base layer. The collector layer is formed in a region of the main surface of the first base layer at a predetermined interval from the above-described second base layer. The shield layer is formed at a region of the main surface of the first base layer at a predetermined interval from the second base layer. The second emitter layer is formed in a region in the first base layer located between the second base layer and the shield layer. The gate electrode is formed in a region on the first and the second base layers located between the first emitter layer and the second emitter layer, with a gate insulating film interposed therebetween. The gate electrode is formed so as to have a planar area of its region covering the first base layer larger than that of its region covering the second base layer.

Since in this semiconductor device, the first emitter layer of the first conductivity type is formed in a predetermined region of the main surface of the second base layer and the second emitter layer of the first conductivity type is formed in a region of the first base layer located between the second base layer and the shield layer, an injection factor of an emitter can be improved by the second emitter layer, thereby allowing an ON-state voltage to be lower than that of a conventional device. Furthermore, the gate electrode formed to have a planar area of its region covering the first base layer larger than that of its region covering the second base layer enables reduction of the ON-state voltage.

In a semiconductor device manufacturing method according to a still further aspect of the present invention, a second base layer of a second conductivity type is formed by diffusing an impurity at a predetermined position of the main surface of a first base layer of a first conductivity type into a predetermined region of the main surface of the first base layer. After forming the second base layer, a gate electrode is formed on the main surfaces of the first and second base layers such that its first side end portion is located nearer to an emitter region than to the predetermined position of the first base layer and that a planar area of its region covering the first base layer is larger than that of its region covering the second base layer. With respect to the first side end portion of the gate electrode, an impurity is diffused into the second base layer to form an emitter layer of the first conductivity type so as to have its side end surface located nearer to the first side end portion of the gate electrode than to the above-described predetermined position.

In this semiconductor device manufacturing method, since the second base layer is formed by diffusing an impurity at a predetermined position of the main surface of the first base layer, the gate electrode is then formed so as to have its first side end portion located nearer to the emitter region than to the above-described predetermined position of the first base layer, and the emitter layer is formed so as to have its side end surface located nearer to the first side end portion of the gate electrode than to the above predetermined position by diffusing an impurity into the second base layer with respect to the first side end portion of the gate electrode, a channel region formed in the main surface of the second base layer located between the emitter layer and the first base layer is partially constituted by the longitudinal diffusion region of the second base layer. In this case, a threshold voltage of the channel region is determined by a longitudinal diffusion region of higher impurity concentration. When in forming such a high breakdown voltage element as described above and a low breakdown voltage element such as a MOS transistor on the same substrate, this enables formation of a well region whose longitudinal diffusion region defines a threshold voltage of the low breakdown voltage element and the above-described second base layer by the same process, resulting in simplification of a manufacturing process. In addition, the gate electrode formed to have a planar area covering the first base layer larger than that covering the second base layer leads to manufacture, with ease, of a semiconductor device with a low ON-state voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to drawings.

Figure 1:
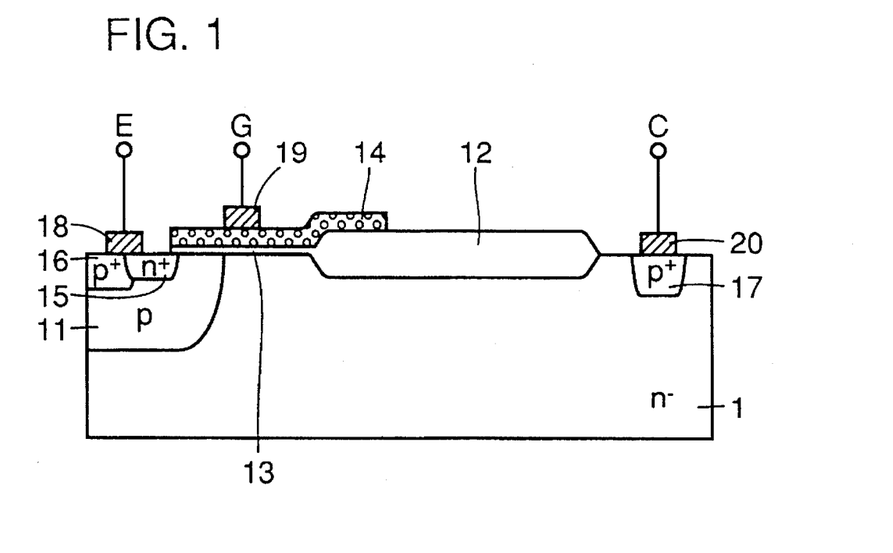
FIG. 1 is a sectional view showing a horizontal IGBT according to a first embodiment of the present invention.

With reference to FIG. 1, in a semiconductor device according to a first embodiment, a p-type base layer 11 is formed in a predetermined region of the main surface of an n-type base layer 1 made of an n-type high-resistance semiconductor substrate. An n-type emitter layer 15 is formed in a predetermined region of the main surface of p-type base layer 11. A p+ layer 16 is formed in the main surface of p-type base layer 11 so as to be adjacent to n-type emitter layer 15. A p-type collector layer 17 is also formed in a region of n-type base layer 1 at a predetermined interval from p-type base layer 11.

A field oxide film 12 for isolating elements is formed at a predetermined region of the main surface of n-type base layer 1 located between p-type base layer 11 and p-type collector layer 17. A gate electrode 14 is formed on p-type base layer 11 between field oxide film 12 and emitter layer 15 and on the main surface of n-type base layer 1, with a gate insulating film 13 interposed therebetween. Gate electrode 14 is formed also to extend on the upper surface of field oxide film 12.

Here, gate electrode 14 in the first embodiment is formed to have a planar area of its region covering the main surface of n-type base layer 1 located between p-type base layer 11 and field oxide film 12 larger than that of its region covering p-type base layer 11 located between n-type emitter layer 15 and n-type base layer 1. This arrangement enables an ON-state voltage to be lower than that of a conventional device. The following is the reason for it.

Figure 2:
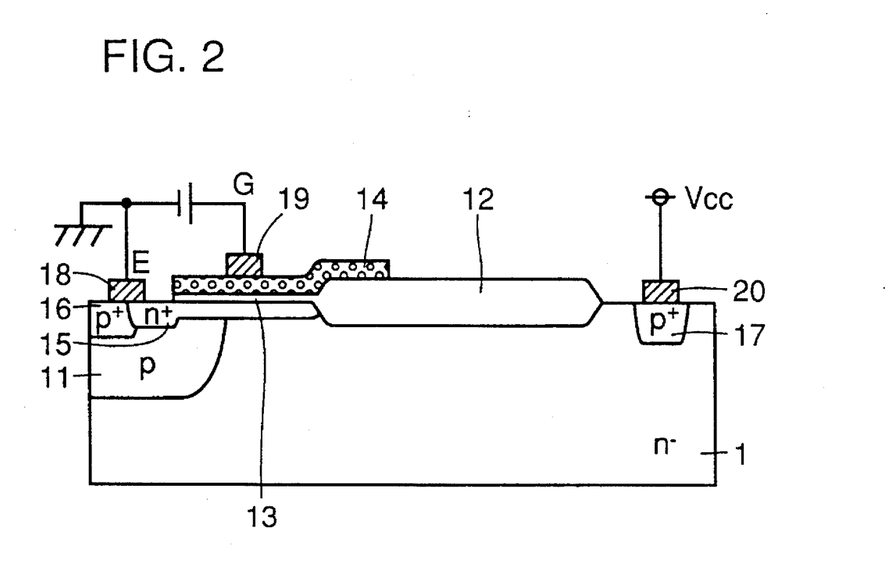
FIG. 2 is a sectional view of the horizontal IGBT of the first embodiment shown in FIG. 1 in the on state.

First, in the horizontal IGBT shown in FIG. 1, a gate capacitance is increased by extending an overlap region between gate electrode 14 and n-type base layer 1. As shown in FIG. 2, however, the surface of p-type base layer 11 is inverted to the n type when the IGBT is in the on state. As a result, the surface of n-type base layer 1 overlapped with gate electrode 14 turns to an n-type storage layer. With the part of the n-type storage layer expressed by Wn and a junction portion between n-type base layer 1 and p-type base layer 11 by Wp, the IGBT is assumed to be equivalent to such a cathode-shorted diode as shown in FIG. 3.

Figure 3:
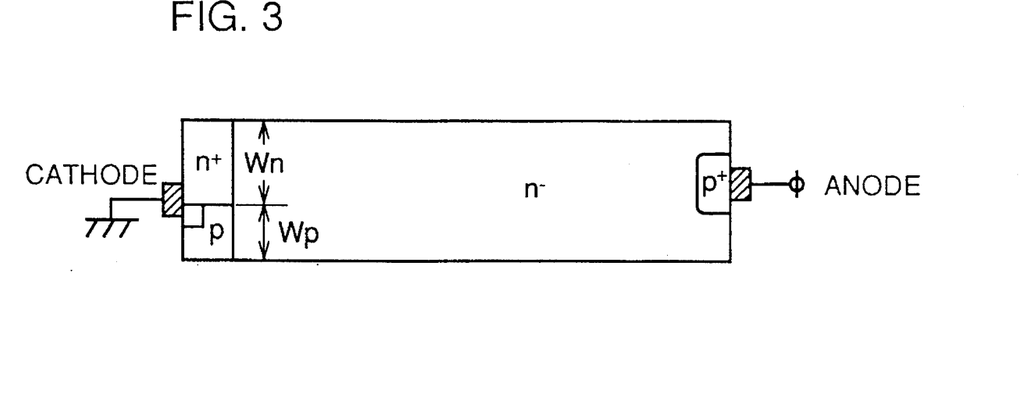
FIG. 3 is a schematic diagram showing a cathode diode equivalent to the horizontal IGBT shown in FIG. 2 in the on state.

With reference to FIG. 3, the emitter side of the IGBT corresponds to the cathode of the cathode-shorted diode and the collector side of the IGBT corresponds to the anode of the cathode-shorted diode. The larger a cathode short-circuit ratio (Wn/(Wn+Wp)) is, the smaller a forward voltage of the cathode-shorted diode becomes. Wn represents a width of an n-type diffusion layer and Wp represents a width of a p-type diffusion layer. It is therefore possible to increase a cathode short-circuit ratio by increasing a width (Wn) of an overlap region between gate electrode 14 and n-type base layer 1. This allows an ON-state voltage to be lower than a conventional ON-stage voltage.

With reference to FIGS. 4 to 7, description will be given of a process of manufacturing the IGBT according to the first embodiment shown in FIG. 1.

Figure 4:
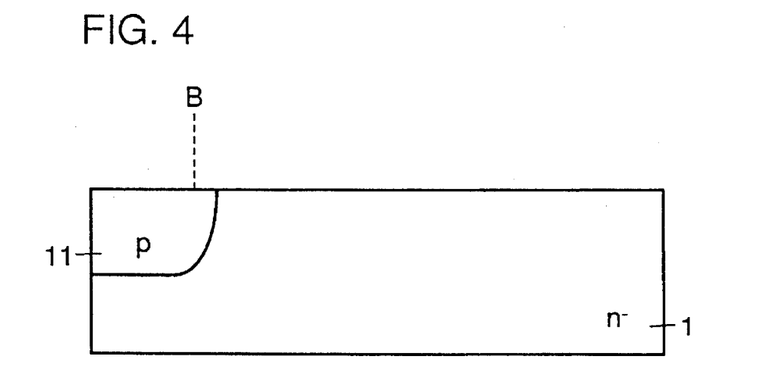
FIG. 4 is a sectional view illustrating a first step of a manufacturing process for the horizontal IGBT according to the first embodiment shown in FIG. 1.
Figure 5:
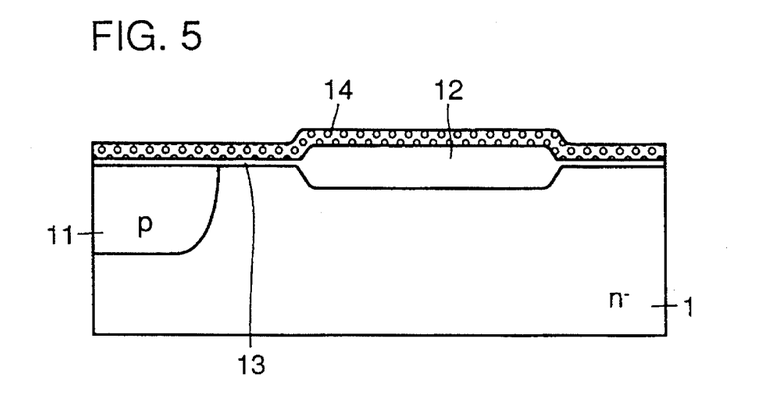
FIG. 5 is a sectional view illustrating a second step of the manufacturing process for the horizontal IGBT according to the first embodiment shown in FIG. 1.
Figure 6:
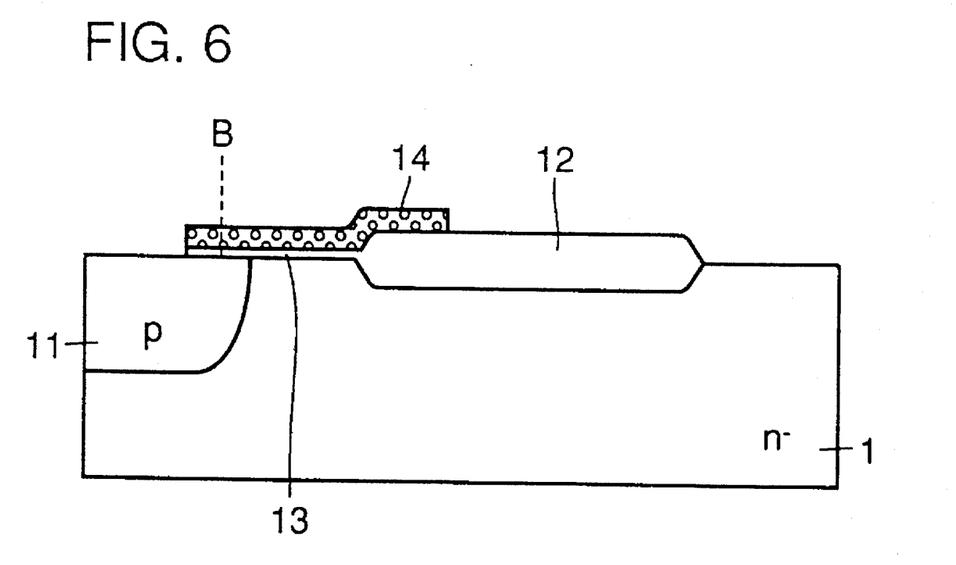
FIG. 6 is a sectional view illustrating a third step of the manufacturing process for the horizontal IGBT according to the first embodiment shown in FIG. 1.

First, as shown in FIG. 4, a p-type base layer 11 is formed by diffusing an impurity into a high-resistance n-type base layer 1 from the left of a predetermined position B of the main surface of the same. Then, such a field oxide film 12 as shown in FIG. 5 is formed by the LOCOS method. Thereafter, a gate insulating film 13 and a polysilicon film 14 to be a gate electrode are formed. Then, polysilicon film 14 and gate insulating film 13 are patterned into such a gate electrode 14 and a gate insulating film 13 as shown in FIG. 6.

Figure 7:
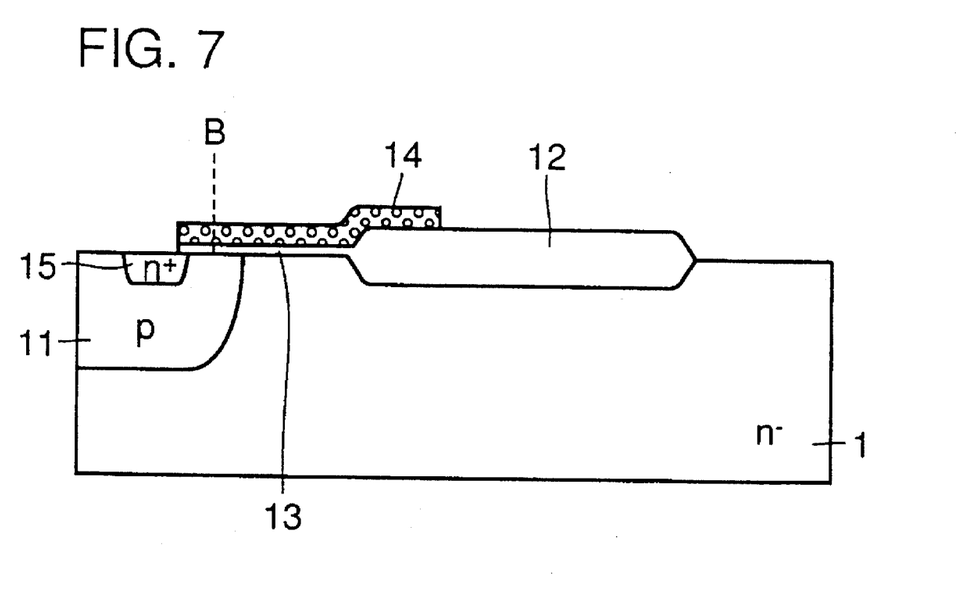
FIG. 7 is a sectional view illustrating a fourth step of the manufacturing process for the horizontal IGBT according to the first embodiment shown in FIG. 1.

Here, gate electrode 14 is formed to have its left side end portion located to the left of the position B. Thereafter, an n-type emitter layer 15 is formed by diffusing an impurity into p-type base layer 11 by the self-alignment technique, with the side end portion of gate electrode 14 as a mask. N-type emitter layer 15 is formed so as to have its right end surface located to the left of the position B. Here, a region of p-type base layer 11 located to the left of the position B is a longitudinal diffusion region. In the IGBT according to the first embodiment, a region of p-type base layer 11 located to the right of n-type emitter layer 15 is accordingly a longitudinal diffusion region. A part of the channel region on the main surface of p-type base layer 11 located between n-type emitter layer 15 and n-type base layer 1 is therefore a longitudinal diffusion region. Because a longitudinal diffusion region has an impurity concentration higher than that of a horizontal diffusion region, the threshold voltage is determined by the longitudinal diffusion region.

In a conventional IGBT, the channel region is formed only of a horizontal diffusion region of p-type base layer 11 as mentioned above. On the other hand, in a well region of a low breakdown voltage MOSFET formed on the same substrate as the conventional high breakdown voltage IGBT is, a channel region is formed of its longitudinal diffusion region. It is therefore difficult to form a portion to be a channel region of n-type base layer 3 of the convention IGBT (see FIG. 19) and a portion to be a channel region of p-type well diffusion layer 6 (see FIG. 20) to have the same impurity concentration by the same process.

Since in the IGBT of the present embodiment, a threshold voltage is defined by the longitudinal diffusion region of p-type base layer 11, p-type base layer 11 can be formed by the same process as that for p-type well diffusion layer 6 (see FIG. 20) of the low breakdown voltage MOSFET whose longitudinal diffusion region defines a threshold voltage. In other words, because the amount of impurity diffusion at the time of the formation of p-type base layer 11 of the IGBT can be the same as that at the time of the formation of the well region of the low breakdown voltage MOSFET, it is possible to form p-type base layer 11 and p-type well diffusion layer 6 of the low breakdown voltage MOSFET by the same process.

Figure 8:
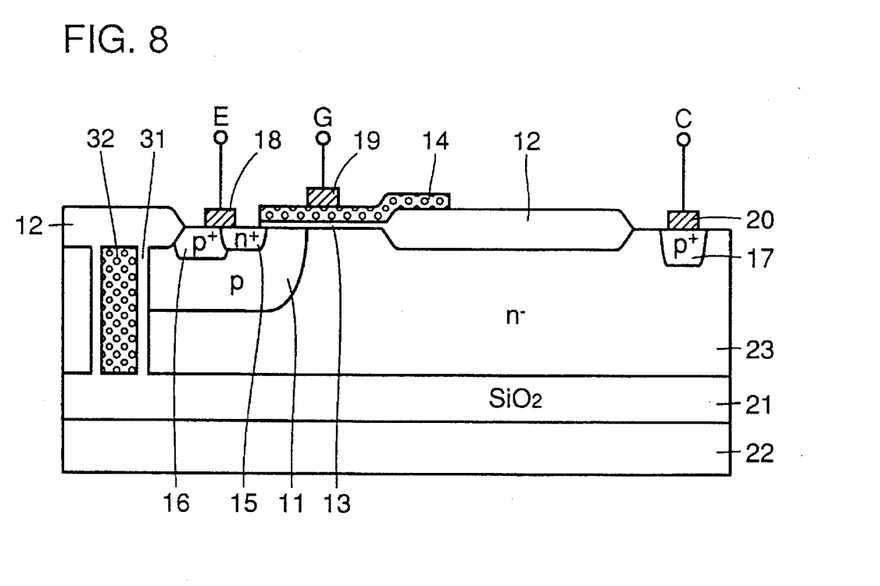
FIG. 8 is a sectional view showing a horizontal IGBT according to a second embodiment of the present invention.

With reference to FIG. 8, a horizontal IGBT of the second embodiment is an illustration in which the horizontal IGBT of the first embodiment shown in FIG. 1 is formed on a dielectric isolation substrate. More specifically, a substrate or a wafer has a supporting layer 22 and an n-type active layer 23 insulated from each other by an oxide film 21. Such a substrate can be obtained by the clad SOI method or SIMOX method.

In active layer 23, an oxide film 31 and a polysilicon buried layer 32 are provided for dielectric isolation between a high breakdown voltage IGBT and other high breakdown voltage element or low breakdown voltage element. Applicable as this dielectric isolation structure are those using a trench groove like the present embodiment and those using a V groove.

Figure 9:
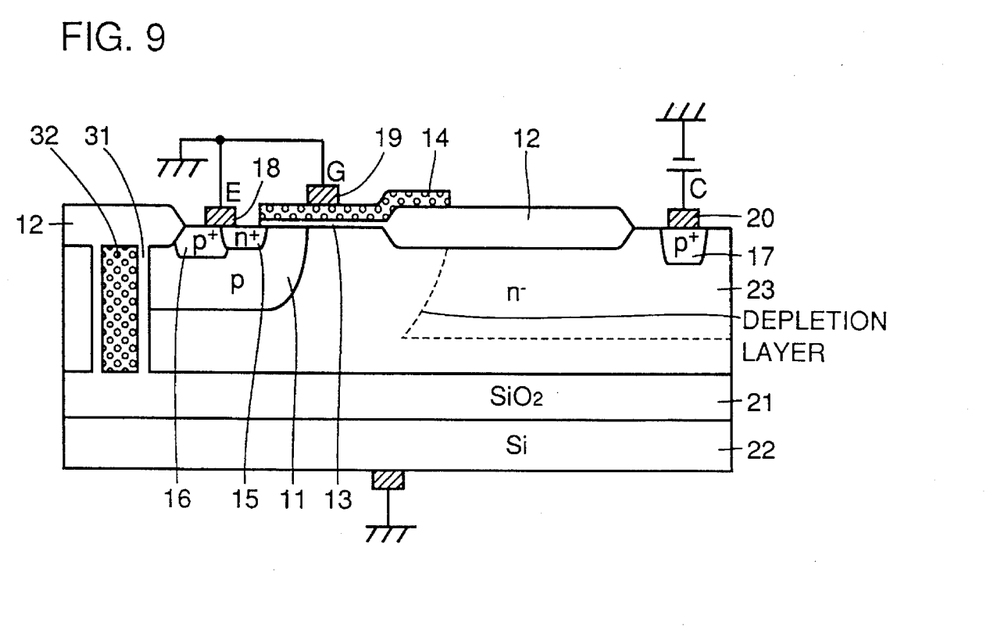
FIG. 9 is sectional view showing the IGBT according to the second embodiment shown in FIG. 8 in the off state.

With reference to FIG. 9, when the horizontal IGBT is in the off state, an emitter electrode 18, a gate contact electrode 19 and a supporting substrate 22 are set to 0V and a collector electrode 20 is supplied with a positive voltage, whereby a depletion layer extends from a p-type base layer 11 toward a p-type collector layer 17. As a result, a potential of n-type base layer 23 located directly under the gate electrode rises. It is therefore necessary to determine a maximum overlap between a gate electrode 14 and high-resistance n-type base region 23 so as not to cause dielectric destruction of a gate insulating film 13.

Figure 10:
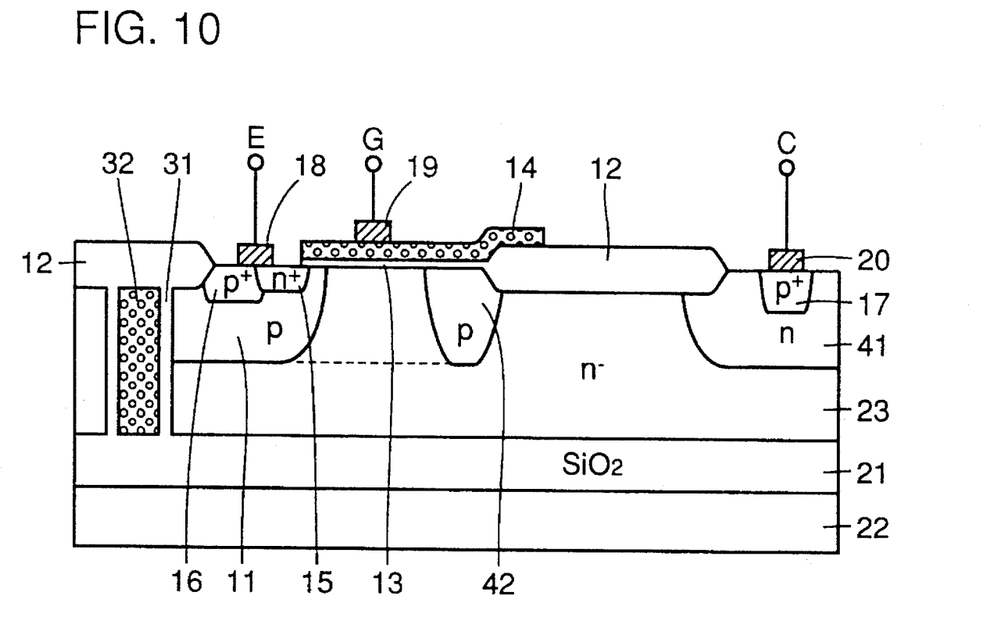
FIG. 10 is a section view showing a horizontal IGBT according to a third embodiment of the present invention.
Figure 11:
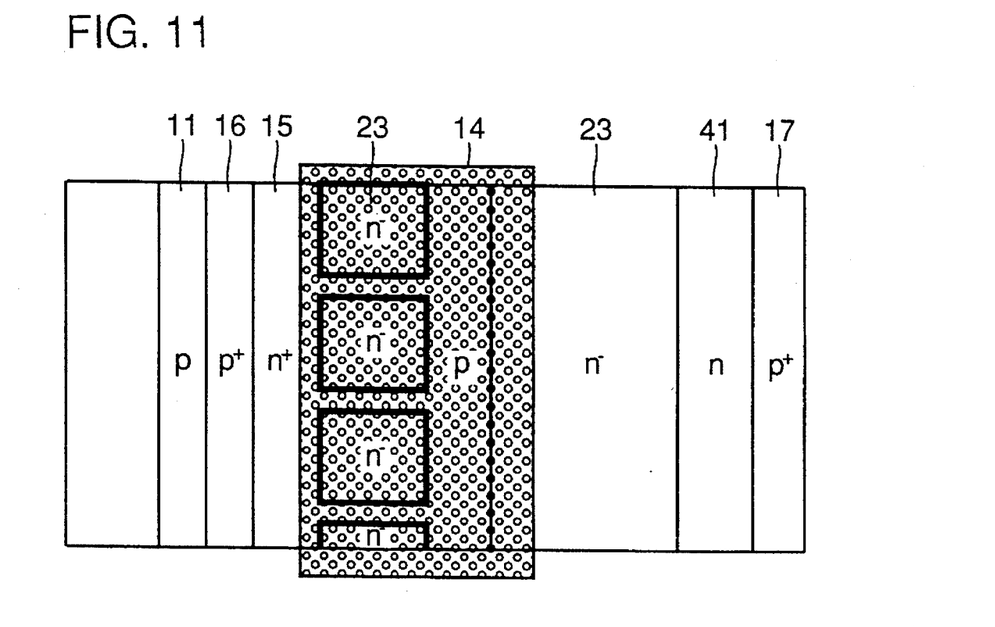
FIG. 11 is a plan view of the horizontal IGBT according to the third embodiment shown in FIG. 10.

With reference to FIGS. 10 and 11, a horizontal IGBT of this third embodiment is also formed on a dielectric isolation substrate similarly to the above-described second embodiment. In addition, an n-type buffer layer 41 covering p-type collector layer 17 is provided to suppress the depletion layer in this third embodiment. In the third embodiment, a p-type diffusion layer 42 is also formed in a region of the main surface of n-active layer 23 in the vicinity of the end portion of a field oxide film 12 in order to prevent dielectric destruction of a gate under a high breakdown voltage.

P-type diffusion layer 42 partly short-circuits with p-type base layer 11 located right under an n-type emitter layer 15 as shown in fig.11, whereby p-type diffusion layer 42, which is a shield layer for preventing dielectric destruction of the gate, attains the same potential as that of the emitter. Thereafter, in a case where n-type emitter layer 15 and gate electrode 14 are short-circuited with each other to attain 0 V and a positive voltage is applied between p-type collector layer 17 and n-type emitter layer 15 when the IGBT is in the off state, the depletion layer will extend from p-type diffusion layer 42 toward p-type collector layer 17. As a result, since the potential of n-type base layer 23 directly under gate electrode 14 does not rise, dielectric destruction of gate insulating film 13 can be effectively prevented. In this case, unlike the above-described first and second embodiments, because a maximum overlap between gate electrode 14 and n-type base layer 23 can be determined unrestrictedly without taking dielectric destruction of the gate into consideration, it is possible to achieve further reduction of an ON-state voltage as compared with the first and second embodiments.

Besides, since p-type diffusion layer 42 can be formed by the same process as that for p-type base layer 11, no complication of the manufacturing process is involved.

Figure 12:
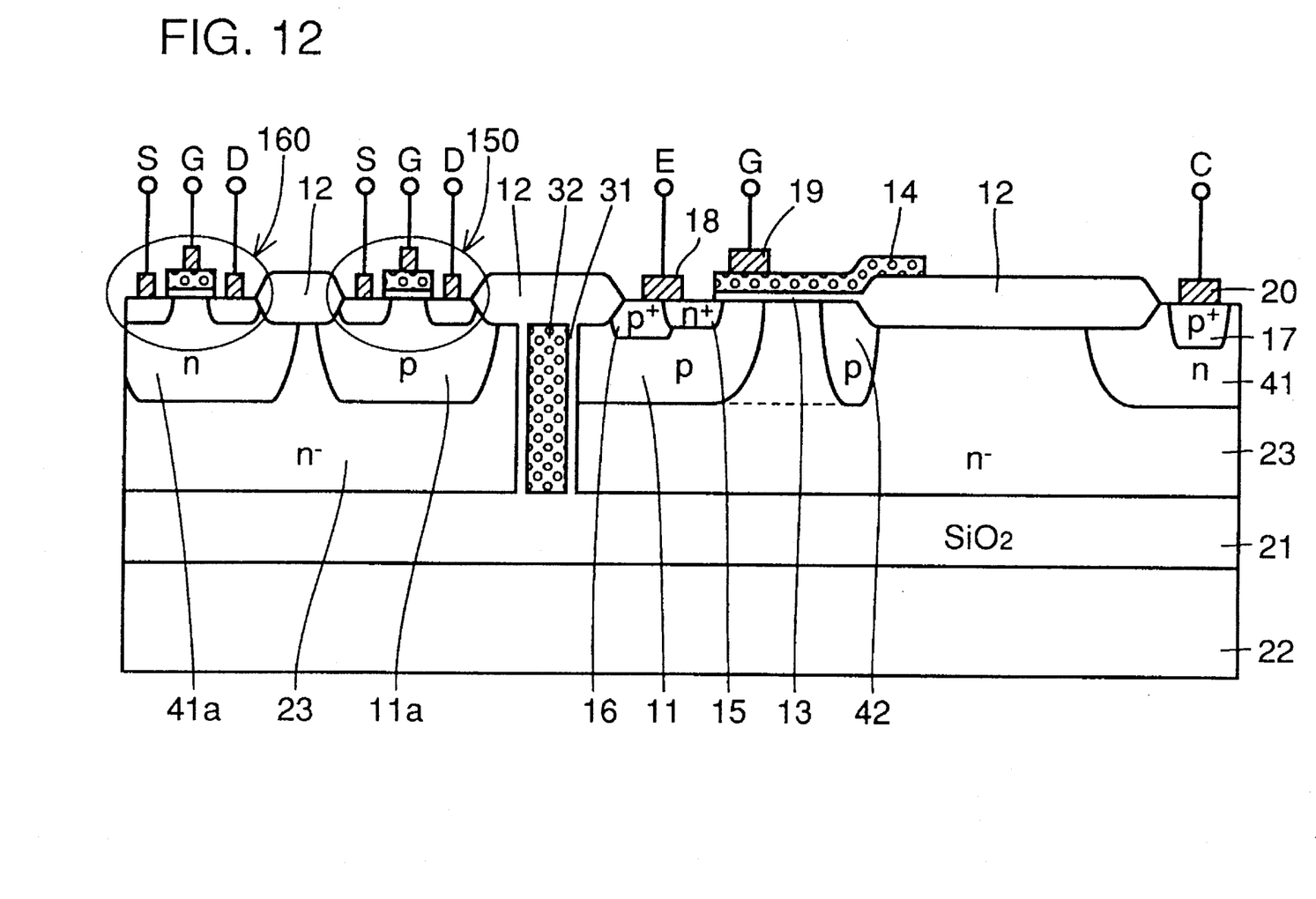
FIG. 12 is a sectional view showing an example of an application of the horizontal IGBT according to the third embodiment shown in FIGS. 10 and 11.

With reference to FIG. 12, which is an illustration of application of the third embodiment, the horizontal IGBT of the third embodiment shown in FIGS. 10 and 11 and a low breakdown voltage element are formed on the same substrate. Provided as the low breakdown voltage elements are an NMOSFET 150 formed in the main surface of a p-type well region 11a and a PMOSFET 160 formed in the main surface of an n-type well region 41a. NMOSFET 150 and PMOSFET 160 are isolated from each other by field oxide film 12. Here, p-type well region 11a can be formed by the same process as that for p-type base layer 11 of the IGBT as described in the first embodiment. On the other hand, n-type well region 41a can be formed by the same process as that for n-type buffer layer 41. These allow simplification of the manufacturing process.

Figure 13:
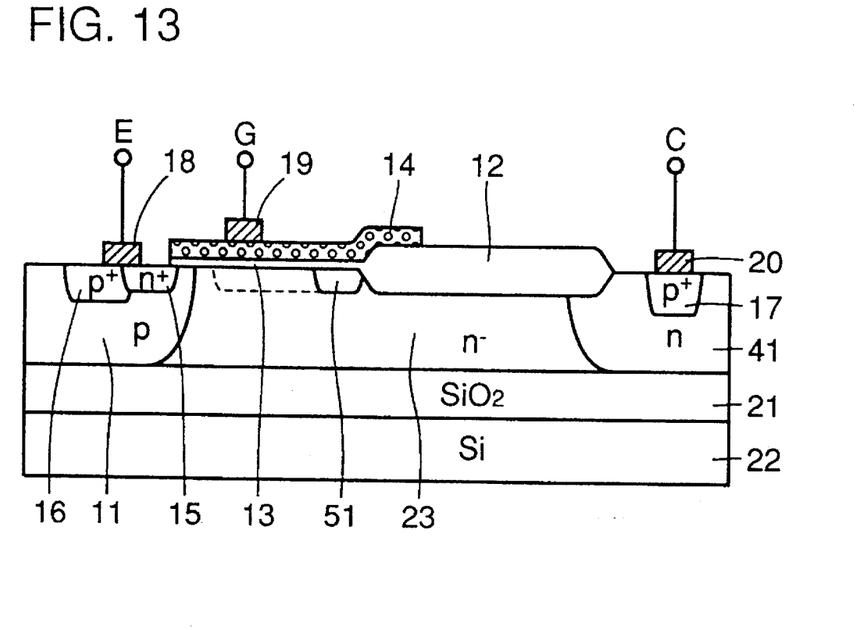
FIG. 13 is a sectional view showing a horizontal IGBT according to a fourth embodiment of the present invention.
Figure 14:
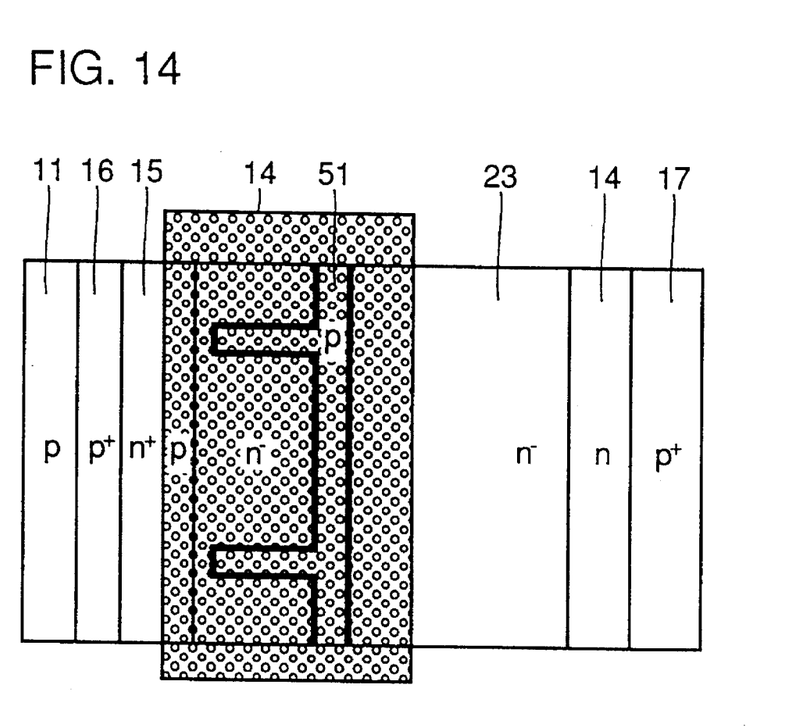
FIG. 14 is a plan view of the horizontal IGBT according to the fourth embodiment shown in FIG. 13.

With reference to FIGS. 13 and 14, in this fourth embodiment, a p-type diffusion layer 51 as a shield layer for preventing dielectric destruction of the gate is formed similarly to the third embodiment shown in FIG. 10. P-type diffusion layer 51, as illustrated in FIG. 14, extends in stripes to the vicinity of n-type emitter layer 15 but does not connect to the same.

In the on state, p-type diffusion layer 51 is therefore independent on a cathode short-circuit ratio (Wn/(Wn+Wp)) to allow the ON-state voltage to be lower than a conventional ON-state voltage. In the off state, the depletion layer extends from p-type diffusion layer 11 at the time point where the potential of gate contact electrode 19 attains 0V and the extended depletion layer reaches p-type diffusion layer 51 in the vicinity of n-type emitter layer 15. This effectively prevents dielectric destruction of the gate. A negative voltage may be applied to gate contact electrode 19 to invert the surface of n-type base layer 23 to the p-type such that p-type diffusion layer 51 and n-type emitter layer 15 have the same potential. This will result in that the depletion layer extends from p-type diffusion layer 51 toward p-type collector layer 17 to effectively prevent dielectric destruction of the gate.

In this fourth embodiment, p-type base region 11 and n-type buffer layer 41 are formed to be in contact with oxide film 21 as illustrated in FIG. 13.

Figure 15:
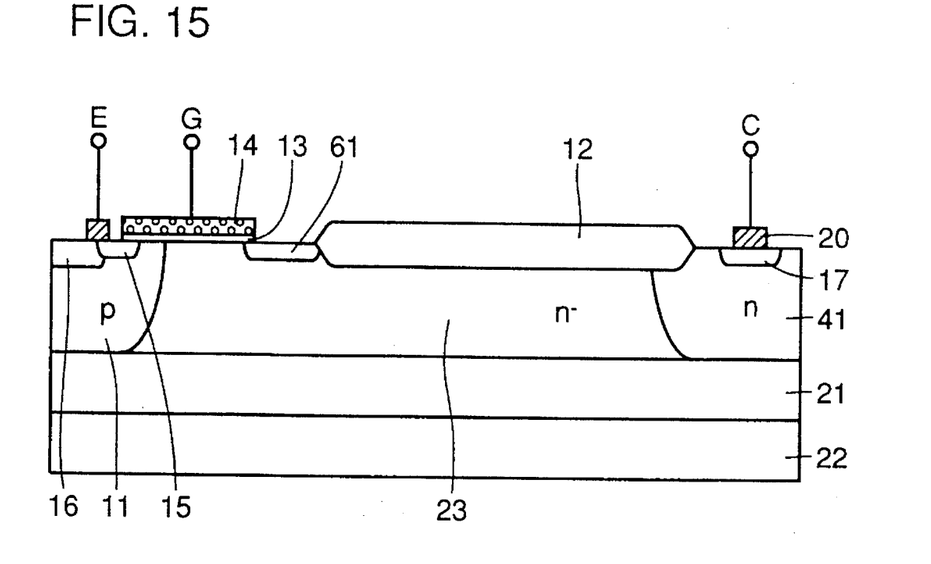
FIG. 15 is a sectional view showing a horizontal IGBT according to a fifth embodiment of the present invention.

With reference to FIG. 15, in a horizontal IGBT according to a fifth embodiment, a p-type diffusion layer 61 as a shield layer is provided similarly to the above-described third and fourth embodiments. Unlike the above fourth embodiment, however, p-type diffusion layer 61 in this fifth embodiment is not formed to partly extend toward the side of p-type base layer 11. In the fifth embodiment, gate electrode 14 is not formed on field oxide film 12. Similarly to the above-described first to fourth embodiments, gate electrode 14 is formed such that a planar area of its region covering the surface of n-type base layer 23 located between p-type base layer 11 and n-type buffer layer 41 is larger than that of its region covering the surface of p-type base layer 11 located between n-type emitter layer 15 and n-type base layer 23.

Also in the fifth embodiment, p-type diffusion layer 61 can have the same potential as that of n-type emitter layer 15 by applying a negative voltage to gate electrode 14 at the time of turn-off to invert the surface of n-type base layer 23 directly under gate electrode 14 to the p-type. This enables p-type diffusion layer 61 to serve as a shield layer. Even the provision of p-type diffusion layer 61 will not complicate the manufacturing process because the layer can be formed by the same process as that for p-type layer 16.

Figure 16:
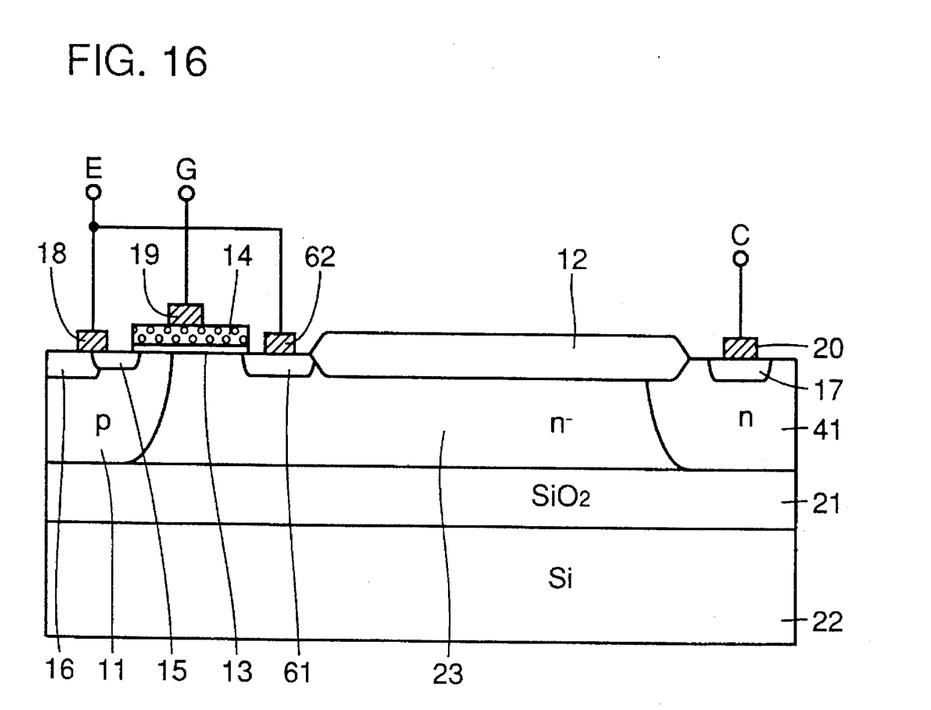
FIG. 16 is a sectional view showing a horizontal IGBT according to a sixth embodiment of the present invention.

With reference to FIG. 16, in a horizontal IGBT of this sixth embodiment, similarly to the above fifth embodiment, a p-type diffusion layer 61 is formed to be a shield layer for preventing dielectric destruction of a gate. P-type diffusion layer 61 is connected to an emitter electrode 18 through a shield electrode 62. Like the above-described first to fifth embodiments, the sixth embodiment allows its ON-state voltage to be lower than a conventional ON-state voltage by providing an overlap region between n-type base layer 23 and gate electrode 14 larger than that between the surface of p-type base layer 11 located between n-type emitter layer 15 and n-type base layer 23 and gate electrode 14. The connection of p-type diffusion layer 61 to emitter electrode 18 through shield electrode 62 not only prevents dielectric destruction of the gate but also enables p-type diffusion layer 61 to serve as an outlet of hole current at the time of turn-off.

More specifically, when a voltage drop determined by hole current flowing into p-type base layer 11 directly under n-type emitter layer 15 and a horizontal resistance of p-type base layer 11 exceeds a built-in voltage of n-type emitter layer 15 and p-type base layer 11, electron fails to stop flowing into the layer 11. As a result, latch-up effects are produced to prevent turn-off. In the sixth embodiment, the latch-up phenomenon is minimized by conducting part of hole current directly into emitter electrode 18 through p-type diffusion layer 61. This enables turn-off at a larger current than that of a conventional transistor. It is therefore possible to conduct a larger than conventional current.

Figure 17:
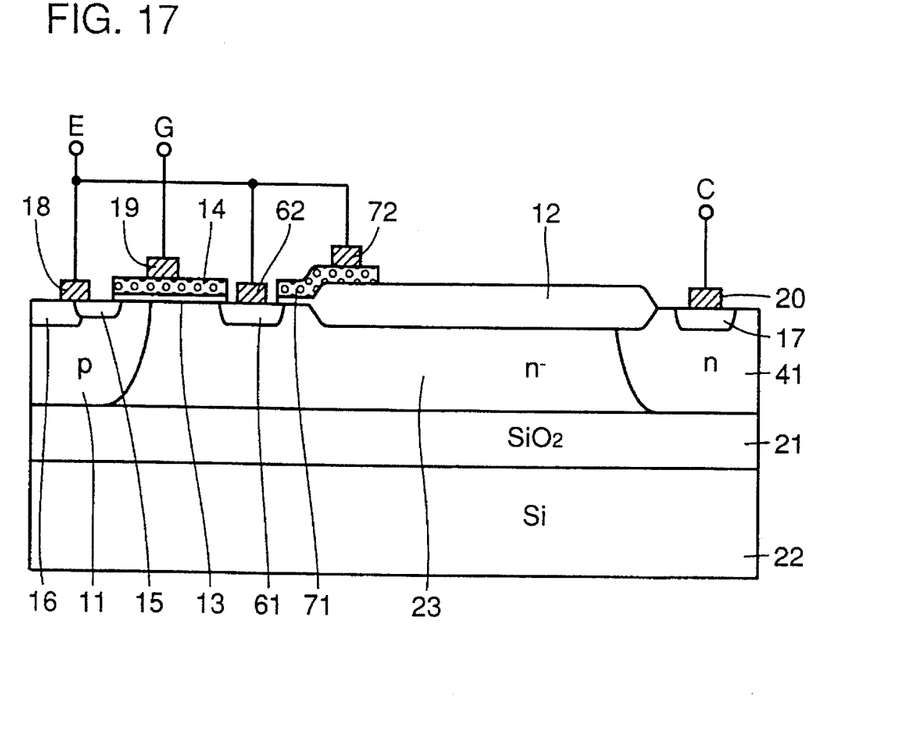
FIG. 17 is a sectional view showing a horizontal IGBT according to a seventh embodiment of the present invention.

With reference to FIG. 17, in a horizontal IGBT according to this seventh embodiment, a field shield gate 71 is provided to cover the end portion of field oxide film 12 in order to prevent dielectric destruction at that portion. Then, field shield gate 71 is directly connected to emitter electrode 18 through a shield gate electrode 72. The remaining arrangement is substantially the same as that of the fourth embodiment shown in FIG. 13.

Figure 18:
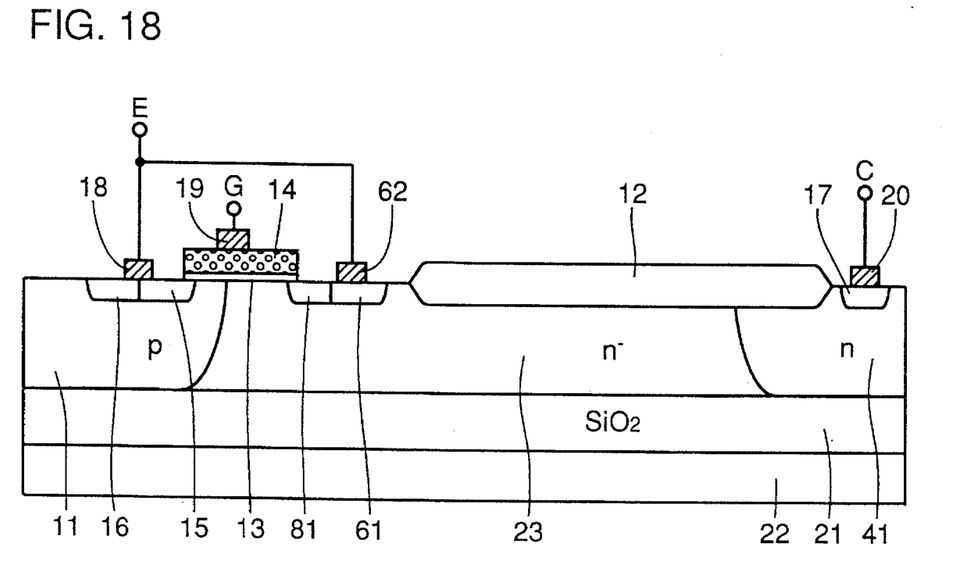
FIG. 18 is a sectional view showing a horizontal IGBT according to an eighth embodiment of the present invention.

With reference to FIG. 18, in a horizontal IGBT according to this eighth embodiment, an n-type emitter layer 81 is formed adjacent to p-type diffusion layer 61 serving as a shield layer. This allows an injection factor of an emitter to be increased, thereby enabling its ON-state voltage to be lower than that in a conventional device. In addition, connecting p-type diffusion layer 61 to emitter electrode 18 through shield electrode 62 leads to improvement of resistance to latch-up effects as in the above-described sixth embodiment.

The semiconductor device according to one aspect of the present invention allows its ON-state voltage to be lower than that of a conventional device through provision of a gate electrode having a planar area of its region covering a first base layer larger than that of its region covering a second base layer. This leads to less power consumption than that of a conventional device. In addition, arrangement of a shield layer in a region of the first base layer in the vicinity of an insulating film between the second base layer and the insulating film can prevent application of high electric fields to a gate insulating film.

According to another aspect of the present invention, a semiconductor device can be obtained in which dielectric destruction of a gate can be prevented and an ON-state voltage can be reduced through provision of a gate electrode having a planar area of its region covering a first base layer larger than that of its region covering a second base layer and provision of a shield layer in a region in the vicinity of an insulating film between the second base layer and the insulating film. By short-circuiting a shield electrode formed on the shield layer and an emitter electrode formed on an emitter layer through an interconnection layer, the shield layer serves as an outlet of hole current at the time of turn-off, which leads to increase in resistance to latch-up effects. As a result, the device can be turned off even at a larger current than that of a conventional device. It is therefore possible to manufacture a semiconductor device capable of conducting a larger than conventional current.

In the semiconductor device according to a still further aspect of the present invention, formation of a first emitter layer of a first conductivity type on the main surface of a second base layer of a second conductivity type and a second emitter layer of the first conductivity type in a region in the first base layer between the second base layer and a shield layer results in the second emitter layer helping improvement of an injection factor of the emitter. As a result, a lower ON-state voltage than that of a conventional device can be obtained.

The semiconductor device manufacturing method according to a still further aspect of the present invention enables formation of a channel region partly made up of a longitudinal diffusion region with ease by forming a second base layer with respect to a predetermined position of the main surface of a first base layer, forming a gate electrode to have its first side end portion located nearer to an emitter region than to the predetermined position, and then forming an emitter layer to have its side end surface located nearer to the first side end portion of the gate electrode than to the above-described predetermined position with respect to the first side end portion of the gate electrode. As a result, when in forming a low breakdown voltage element on the same substrate, the second base layer can be formed by the same process as that for a well region forming a channel region of the low breakdown voltage element. This leads to simplification of a manufacturing process of a semiconductor device in which a high breakdown voltage element and a low breakdown voltage element are formed on the same substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a first base layer of a first conductivity type;

a second base layer of a second conductivity type formed in a predetermined region of the main surface of said first base layer;

an emitter layer of the first conductivity type formed in a predetermined region of the main surface of said second base layer;

a collector layer of the second conductivity type formed in a region of the main surface of said first base layer at a predetermined interval from said second base layer;

a high impurity concentration region of a second conductivity type formed in the main surface of and entirely within said second base layer;

a field oxide formed in a region on the main surface of said first base layer between said second base layer and said collector layer; and a gate electrode comprising a first region formed on said second base layer between said emitter layer and said first base layer and a second region formed on said first base layer with a gate insulating film therebetween, wherein a planar area of said first region is smaller than a planar area of said second region and wherein said gate electrode extends onto an upper surface of said insulating film.

2. The semiconductor device according to claim 1, wherein a shield layer of the second conductivity type is formed in a region of said first base layer in the vicinity of said field oxide between said second base layer and said field oxide in order to prevent application of high electric fields to said gate insulating film.

3. The semiconductor device according to claim 2, wherein said shield layer and said second base layer are short-circuited with each other through an impurity layer of the second conductivity type.

4. The semiconductor device according to claim 2, wherein a part of said shield layer extends to the vicinity of said second base layer.

5. The semiconductor device according to claim 1, wherein said first base layer is formed on an insulating layer; and said second base layer is formed to reach the upper surface of said insulating layer.

6. The semiconductor device according to claim 1, wherein an impurity layer of the first conductivity type is formed in a region of said first base layer where said collector layer is formed so as to cover said collector layer.

7. A semiconductor device comprising:

a first base layer of a first conductivity type;

a second base layer of a second conductivity type formed in a predetermined region of the main surface of said first base layer;

an emitter layer of the first conductivity type formed in a predetermined region of the main surface of said second base layer;

a collector layer of the second conductivity type formed in a region of the main surface of said first base layer at a predetermined interval from said second base layer;

a high impurity concentration region of a second conductivity type formed in the main surface of and entirely within said second base layer;

a field oxide formed in a region on the main surface of said first base layer between said second base layer and said collector layer; and a shield layer of the second conductivity type formed in a region of said first base layer in the vicinity of said field oxide between said second base layer and said field oxide; and a gate electrode comprising a first region formed on said second base layer between said emitter layer and said first base layer and a second region formed on said first base layer with a gate insulating film therebetween, wherein a planar area of said first region is smaller than a planar area of said second region.

8. The semiconductor device according to claim 7, further comprising:

a shield electrode formed on said shield layer; and an emitter electrode formed on said emitter layer, said shield electrode and said emitter electrode being short-circuited with each other through an interconnection layer.

9. The semiconductor device according to claim 7, wherein a shield gate is formed to cover said first base layer and said field oxide in the vicinity of the end portion of said field oxide; and said shield gate is electrically connected to said emitter layer.

10. The semiconductor device according to claim 7, wherein an impurity layer of the first conductivity type is formed in a region of said first base layer where said collector layer is formed so as to cover said collector layer.

11. The semiconductor device according to claim 7, wherein said first base layer is formed on an insulating layer; and said second base layer is formed to reach said insulating layer.

12. A semiconductor device comprising:

a first base layer of a first conductivity type;

a second base layer of a second conductivity type formed in a predetermined region of the main surface of said first base layer;

a first emitter layer of the first conductivity type formed in a predetermined region of the main surface of said second base layer;

a collector layer of the second conductivity type formed in a region of the main surface of said first base layer at a predetermined interval from said second base layer;

a shield layer of the second conductivity type formed in a region on the main surface of said first base layer located between said second base layer and said collector layer;

a second emitter layer of the first conductivity type formed in a region of said first base layer located between said second base layer and said shield layer; and a gate electrode comprising a first region formed on said second base layer between said first emitter layer and said first base layer and a second region formed on said first base layer with a gate insulating film therebetween, wherein a planar area of said first region smaller than planar area of said second region.

13. The semiconductor device according to claim 12, wherein an impurity layer of the first conductivity type is formed in a region of said first base layer where said collector layer is formed so as to cover said collector layer;

said first .base layer is formed on an insulating layer; and said second base layer and said impurity layer are both formed to reach said insulating layer.

* * * * *